United States Patent
Lu

(10) Patent No.: US 11,469,234 B2
(45) Date of Patent: Oct. 11, 2022

(54) SEMICONDUCTOR DEVICE HAVING REDUCED CONTACT RESISTANCE BETWEEN ACCESS TRANSISTORS AND CONDUCTIVE FEATURES AND METHOD OF MANUFACTURING THE SAME

(71) Applicant: NANYA TECHNOLOGY CORPORATION, New Taipei (TW)

(72) Inventor: Tseng-Fu Lu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/098,033

(22) Filed: Nov. 13, 2020

(65) Prior Publication Data
US 2022/0157824 A1    May 19, 2022

(51) Int. Cl.
*H01L 27/108*   (2006.01)
*G11C 5/06*     (2006.01)

(52) U.S. Cl.
CPC ........ *H01L 27/10855* (2013.01); *G11C 5/063* (2013.01); *H01L 27/10814* (2013.01); *H01L 27/10823* (2013.01); *H01L 27/10876* (2013.01); *H01L 27/10885* (2013.01); *H01L 27/10891* (2013.01)

(58) Field of Classification Search
None
See application file for complete search history.

(56) References Cited

U.S. PATENT DOCUMENTS

| | | | | |
|---|---|---|---|---|
| 10,763,212 | B1 * | 9/2020 | Hsieh | H01L 23/528 |
| 2015/0102395 | A1 | 4/2015 | Park et al. | |
| 2015/0340453 | A1 * | 11/2015 | Cho | H01L 27/10814 |
| | | | | 257/330 |
| 2016/0027915 | A1 * | 1/2016 | Kwon | H01L 27/10802 |
| | | | | 257/334 |
| 2018/0175040 | A1 * | 6/2018 | Kim | H01L 27/10855 |
| 2018/0301459 | A1 * | 10/2018 | Kim | B08B 7/0014 |
| 2020/0161294 | A1 | 5/2020 | Lee et al. | |
| 2020/0161305 | A1 * | 5/2020 | Nam | H01L 27/10823 |
| 2020/0168611 | A1 * | 5/2020 | Jeon | H01L 27/10814 |
| 2020/0194439 | A1 * | 6/2020 | Kim | H01L 27/10888 |

OTHER PUBLICATIONS

Office Action and Search Report dated Jun. 2, 2022 of the Taiwanese counterpart application No. 110126959.

* cited by examiner

*Primary Examiner* — Steven M Christopher

(74) *Attorney, Agent, or Firm* — Muncy, Geissler, Olds & Lowe, P.C.

(57) ABSTRACT

The present disclosure provides a semiconductor device. The semiconductor device includes a substrate, a storage capacitor, an access transistor, and at least one conductive feature for electrically coupling the storage capacitor to the access transistor. The substrate includes at least one isolation feature defining a plurality of active regions, wherein a plurality of impurity regions of the access transistor are in the active region. The storage capacitor is disposed over the substrate, and the conductive feature extends from the storage capacitor and into a portion of the substrate where one of the impurity regions is disposed. As a result, a contact area between the access transistor and the conductive feature is increased, and an operation speed of the compact semiconductor device is increased.

10 Claims, 24 Drawing Sheets

SEMICONDUCTOR DEVICE HAVING REDUCED CONTACT RESISTANCE BETWEEN ACCESS TRANSISTORS AND CONDUCTIVE FEATURES AND METHOD OF MANUFACTURING THE SAME

TECHNICAL FIELD

The present disclosure relates to a semiconductor device and a method of manufacturing the same, and more particularly, to a semiconductor device including conductive features, for connecting capacitors to access transistors, that extends into impurity regions of the access transistors, and a method of manufacturing the same.

DISCUSSION OF THE BACKGROUND

The semiconductor industry has experienced rapid growth due to continuous improvements in the integration density of a variety of electronic components including access transistors, storage capacitors, etc. For the most part, this improvement in integration density has come from repeated reductions in minimum feature size, which allows more components to be integrated into a given area.

As semiconductor devices have been highly integrated, a footprint of the conductive contacts for electrically coupling the storage capacitors and the access transistors has been reduced. Thus, a contact resistance between each conductive contact and the access transistors increases. The contact resistance may cause a deterioration (e.g., reduction of an operating speed) of performance of the semiconductor devices.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device includes a substrate, a storage capacitor, an access transistor, and at least one conductive feature. The substrate includes at least one isolation feature defining a plurality of active regions. The storage capacitor is disposed over the substrate. The access transistor includes a plurality of impurity regions in the active region. The conductive feature extends from the storage capacitor and into the substrate for electrically coupling the storage capacitor to the access transistor.

In some embodiments, the conductive feature is inserted into the associated impurity region.

In some embodiments, a portion of the conductive feature in the substrate has a funnel shape.

In some embodiments, the conductive feature includes a lower portion in the substrate and an upper portion interposed between the substrate and the storage capacitor, the lower portion has a first critical dimension, and the upper portion has a second critical dimension greater than the first critical dimension.

In some embodiments, the first critical dimension of the lower portion of the conductive feature gradually decreases at positions of increasing distance from the upper portion.

In some embodiments, the lower portion of the conductive feature has a peripheral surface, which is discontinuous with a peripheral surface of the upper portion of the conductive feature.

In some embodiments, the lower portion and the upper portion of the conductive feature are integrally formed.

In some embodiments, the access transistor further includes a word line and an insulative liner. The word line is disposed in the substrate and across the active regions, and the impurity regions are disposed on either side of the word line; the insulative liner is sandwiched between the substrate and the word line.

In some embodiments, the semiconductor device further includes a dielectric layer, a bit line and a conductive plug. The dielectric layer is disposed between the storage capacitor and the substrate to encapsulate the access transistor and enclose the conductive feature. The bit line is buried in the dielectric layer. The conductive plug extends from the bit line and into the substrate for electrically coupling the bit is line to the access transistor.

In some embodiments, a portion of the conductive plug, inserted into the impurity region, has a third critical dimension and the other portion of the conductive plug, interposed between the bit line and the substrate, has a fourth critical dimension greater than the third critical dimension.

In some embodiments, the storage capacitor includes at least one storage node, a capacitor insulator and a top electrode. The storage node is in contact with the conductive feature, the capacitor insulator encapsulates the storage node, and the top electrode is disposed on the capacitor insulator.

Another aspect of the present disclosure provides a method of manufacturing a semiconductor device. The method includes steps of providing a substrate comprising one or more isolation features defining active regions; forming an access transistor comprising a plurality of impurity regions, wherein the impurity regions are disposed in the substrate; depositing a dielectric layer to cover the access transistor; forming a first contact hole through the dielectric layer to expose the associated impurity region; forming a sacrificial liner in the first contact hole; removing a portion of the substrate exposed through the first contact hole and the sacrificial liner to form a second contact hole connected to the first contact hole; and depositing a conductive material in the first and second contact holes.

In some embodiments, the method further includes a step of removing the sacrificial liner prior to the formation of the conductive feature.

In some embodiments, the first contact hole has a first width and the second contact hole has a second width less than the first width.

In some embodiments, the second width of the second contact hole gradually decreases at positions of increasing distance from the first contact hole.

In some embodiments, the formation of the sacrificial liner includes steps of depositing a sacrificial film on the dielectric layer and the substrate exposed to the first contact hole without filling the first contact hole; and removing portions of the sacrificial film to uncover the substrate.

In some embodiments, the formation of the access transistor includes steps of creating at least one trench in the substrate and across the active regions; depositing a gate insulator in the trench without filling the trench; forming a word line to occupy a bottom of the trench; depositing a capping layer on the word line to cover the word line; and introducing dopants into the substrate to form the impurity regions.

With the above-mentioned configurations of a semiconductor device including the conductive feature partially extending into the substrate, the contact area of the conductive feature and the access transistors increases. Therefore, a contact resistance between the conductive feature and the access transistors is reduced and hence operating speed of the compact semiconductor device is increased.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
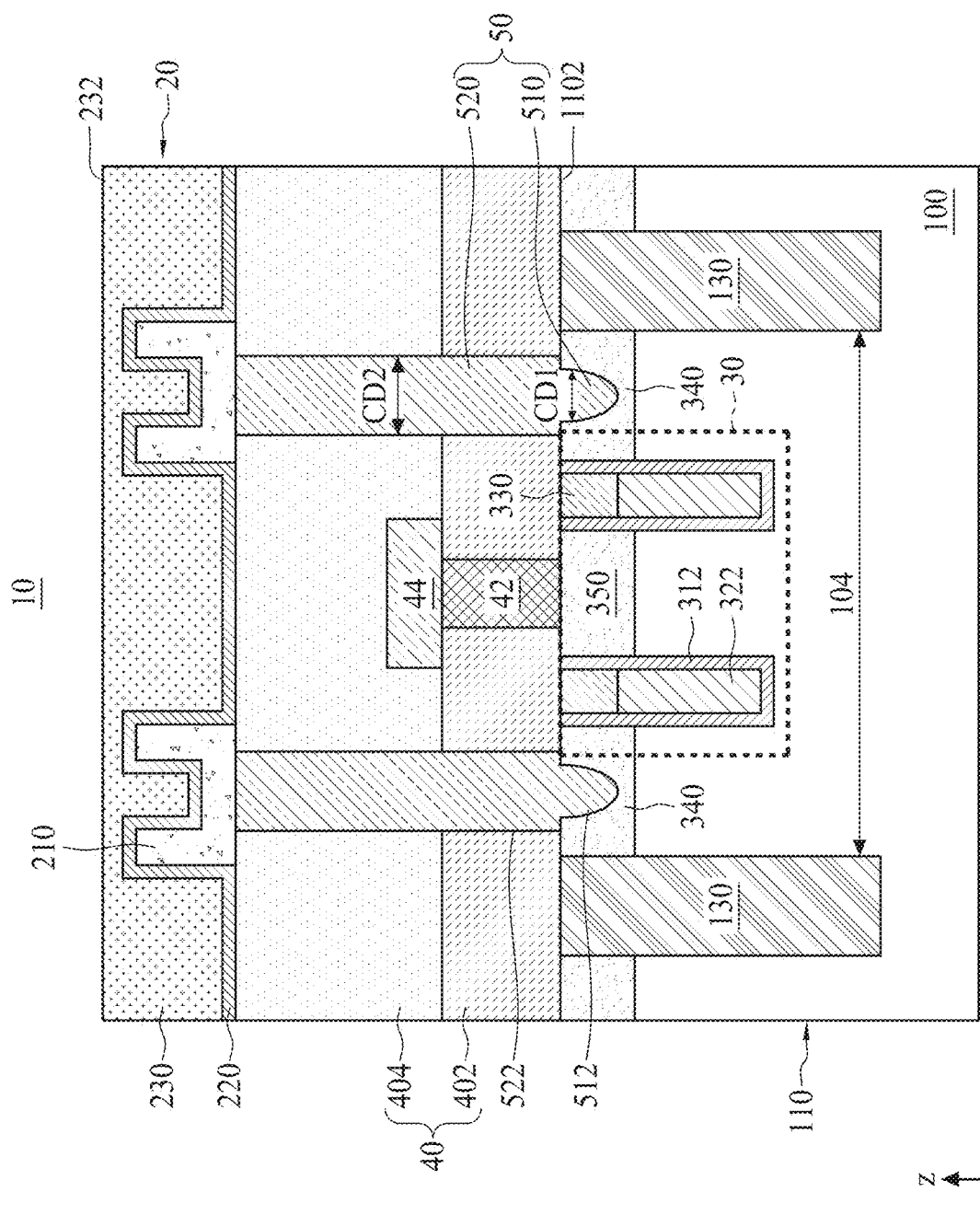
FIG. 1 is a cross-sectional view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a semiconductor device 10 in accordance with some embodiments of the present disclosure. Referring to FIG. 1, the semiconductor device 10 may be a semiconductor memory device such as a dynamic random access memory (DRAM) including one or more storage capacitors 20 and one or more access transistors 30 rendered conductive in response to the potential conducted thereon to couple the storage capacitors 20 to associated bit lines 44. The access transistors 30 shown in FIG. 1 are in a form of a recessed access device (RAD) transistor; however, in some embodiments, the access transistors 30 may be planar access device (PAD) transistors.

The semiconductor device 10 further includes a dielectric layer 40 between the storage capacitors 20 and the access transistors 30 and a plurality of conductive features 50 extending from the storage capacitor 20 and into the substrate 110 to electrically couple the storage capacitors 20 to the access transistors 30. That is, the conductive feature 50 serves as an electrical connection between the storage capacitor 20 and the respective access transistors 30, and the dielectric layer 40 insulates the conductive features 50. The bit line 44 may be buried in the dielectric layer 40 and electrically coupled to the access transistors 30 by at least one conductive plug 42 in the dielectric layer 40.

The storage capacitors 20, over the access transistors 30, include a plurality of storage nodes 210 respectively contacting the conductive features 50, a capacitor insulator 220 encapsulating the storage nodes 210, and a top electrode 230 disposed on the capacitor insulator 220. More particularly, the storage nodes 210, on the conductive features 50 and the dielectric layer 40, are spaced apart and electrically isolated from each other. In some embodiments, the storage nodes 210 are in a U-shaped configuration and function as lower electrodes of the storage capacitor 20. The capacitor insulator 220 can have a topology following the topology of the storage nodes 210 and the dielectric layer 40. The top electrode 230, functioning as an upper electrode of the storage capacitor 20, can have a substantially planar top surface 232; however, in some embodiments, the top electrode 230 may be a conformal layer.

Figure 2:
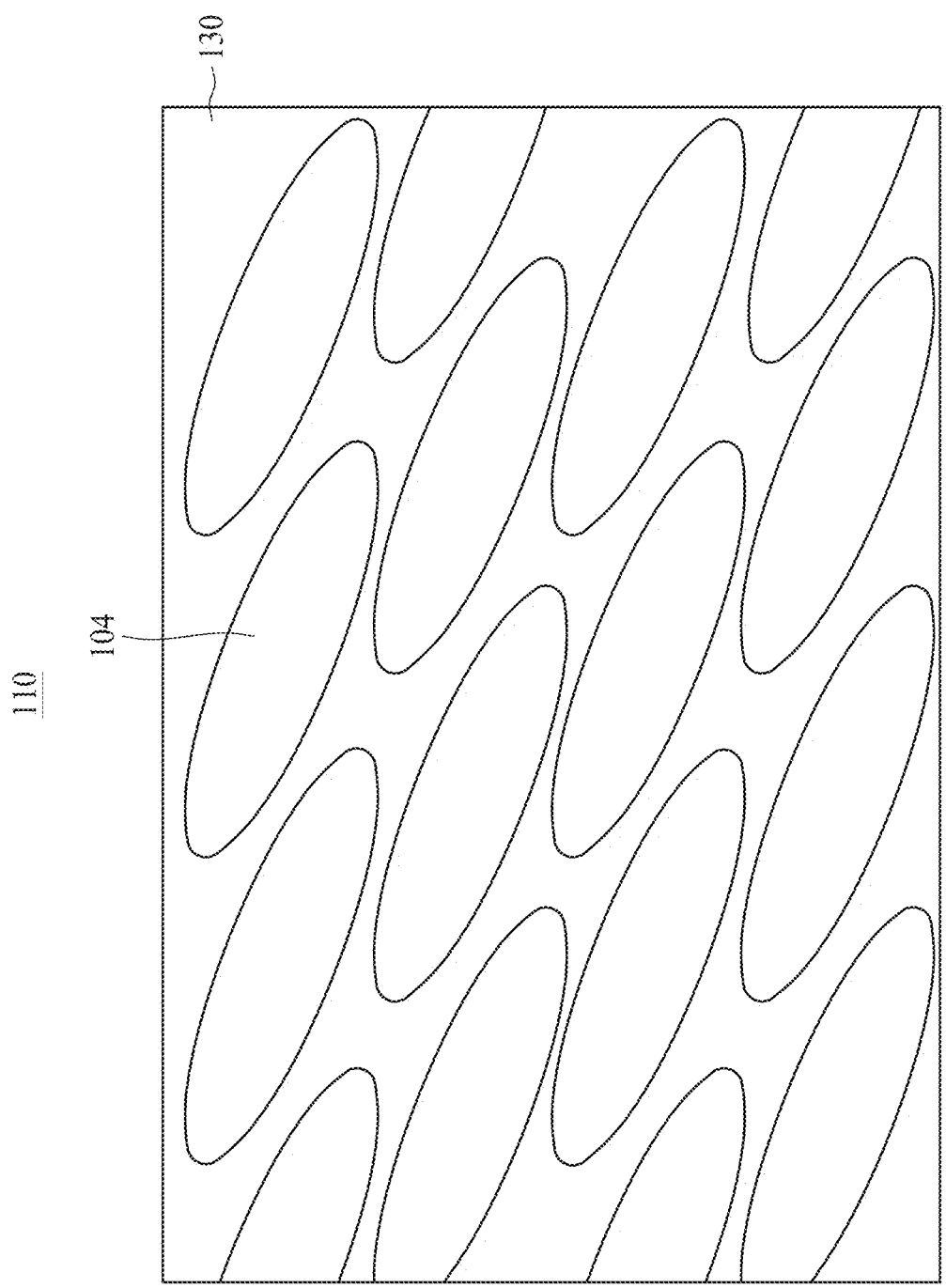
FIG. 2 is a plan view of a substrate in accordance with some embodiments of the present disclosure.

The access transistors 30 are disposed in a substrate 110 as shown in FIG. 2. Referring to FIGS. 1 and 2, the substrate 110 has one or more isolation features 130 defining active regions 104 in which the access transistors 30 are formed.

The active regions 104 may be elongated island-shaped regions. For example, the active regions 104 can have an elliptical shape as viewed in the plan view. In addition, the active regions 104 may be disposed such that major axes (along a longitudinal direction) of the active regions 104 are not parallel to either an x-axis or a y-axis of an orthogonal coordinate system.

The access transistors 30, in the active region 104, include a plurality of word lines 322 buried in the substrate 110 and covered by a capping layer 330, a plurality of insulative liners 312 disposed between the substrate 110 and the word lines 322 and between the substrate 110 and the capping layer 330, and a plurality of impurity regions 340 and 350 disposed on either side of the word lines 322. The word lines 322 extend longitudinally in the y-axis and across the active regions 104 while the bit line 44 extends longitudinally in the x-axis orthogonal to the y-axis. The active regions 104 may be oriented such that their major axes are oblique with respect to the word lines 322 and the bit lines 44 and may be sized such that one active region 104 intersects two word lines 322 and one bit line 44.

Referring again to FIG. 1, the impurity regions 340 and 350 serve as drain and source regions of the access transistors 30. The impurity regions 340 and 350 may be connected to an upper surface 1102 of the substrate 110. The impurity regions 340 are electrically coupled to the bottom electrodes 210 of the storage capacitor 20 by the conductive features 50, while the impurity region 350 is electrically coupled to the bit line 44 by the conductive plug 42. The word lines 322 function as gates in the access transistors 30 they pass through, and the bit line 44, formed using a damascene process, functions as a signal for the sources of the access transistors 30 to which it is electrically coupled.

The conductive features 50 are disposed on either side of the conductive plug 42. Because the active regions 104 have an elliptical shape, landing areas of the conductive features 50 are less than a landing area of the conductive plug 42. As a result, a contact area of the access transistor 30 and the conductive feature 50 is reduced, and a contact resistance therebetween is increased. In order to overcome such problem, the conductive features 50 of the present invention are designed to extend into the substrate 110.

More particularly, each conductive feature 50 includes a lower portion 510 inserted into the impurity region 340 of the access transistor 30 and an upper portion 520 interposed between the upper surface 1102 of the substrate 110 and the storage capacitor 20. The lower portion 510 of the conductive feature 50, extending into the substrate 110, can increase the contact area of the conductive feature 50 and the substrate 110 in which the access transistor 30 is disposed. Therefore, the contact resistance between the access transistor 30 and the associated conductive feature 50 can be effectively reduced. The upper portion 520 of the conductive feature 50 is surrounded by the dielectric layer 40 comprised of a first dielectric layer 402 covering the substrate 110 and a second dielectric layer 404 sandwiched between the first dielectric layer 402 and the storage capacitor 20.

Still referring to FIG. 1, the lower portion 510 of the conductive feature 50, beneath the upper surface 1102 of the substrate 110, can have a first critical dimension CD1, and the upper portion 520 of the conductive feature 50, above the upper surface 1102 of the substrate 110, can have a second critical dimension CD2 greater than the first critical dimension CD1. In some embodiments, the first critical dimension CD1 gradually decreases at positions of increasing distance from the upper surface 1102 of the substrate 110, while the second critical dimension CD2 is constant. In particular, a peripheral surface 512 of the lower portion 510 of the conductive feature 50 is discontinuous with a peripheral surface 522 of the upper portion 520 thereof. Notably, the lower portion 510 and the upper portion 520 of the conductive feature 50, including polysilicon, are integrally formed.

Figure 3:
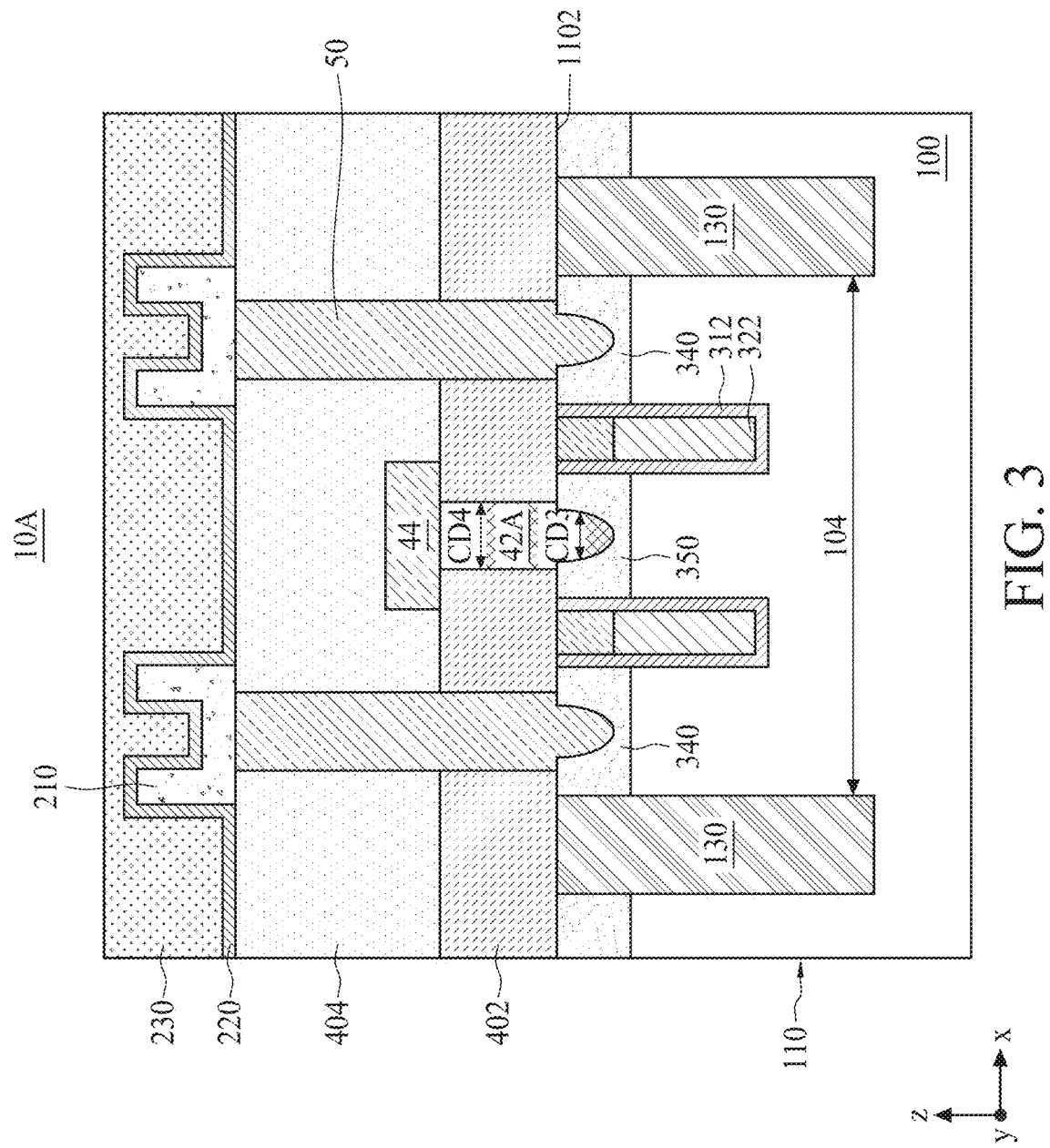
FIG. 3 is a cross-sectional view of a semiconductor device in accordance with some embodiments of the present disclosure.

FIG. 3 is a cross-sectional view of a semiconductor device 10A in accordance with some embodiments of the present disclosure. It should be noted that the semiconductor device 10A shown in FIG. 3 contains many features that are same as or similar to features of the semiconductor device 10 disclosed with respect to FIG. 1. For purpose of clarity and simplicity, detailed description of the same or similar features may be omitted, and the same or similar reference numbers denote the same or similar components.

The main differences between the semiconductor device 10A shown in FIG. 3 and the semiconductor device 10 shown in FIG. 1 are described as follows. Referring to FIG. 3, the conductive plug 42A for electrically coupling the bit line 44 to the impurity region 350 extends from the bit line 44 and into the substrate 110. Therefore, a contact resistance between the access transistor 30 and the associated conductive plug 42A can be effectively reduced.

In some embodiments, a portion of the conductive plug 42A in the substrate 110 has a third critical dimension CD3, and a portion of the conductive plug 42A between the substrate 110 and the bit line 44 has a substantially uniform fourth critical dimension CD4 greater than the third critical dimension CD3. In addition, the third critical dimension CD3 may gradually decrease at positions of increasing distance from an upper surface 1102 of the substrate 110.

Figure 4:
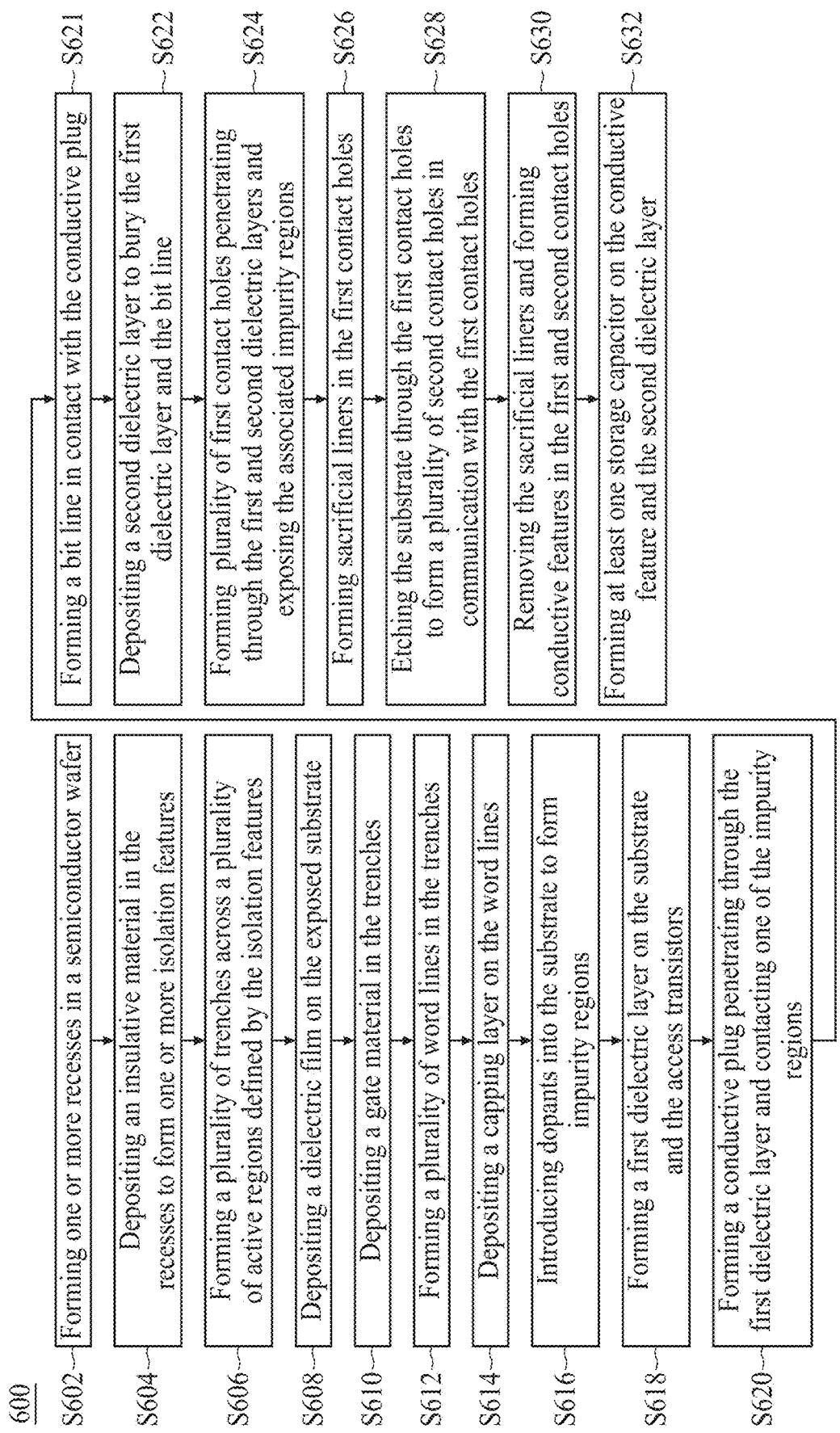
FIG. 4 is a flow diagram illustrating a method of manufacturing a semiconductor device in accordance with some embodiments of the present disclosure.

FIG. 4 is a flow diagram illustrating a method 600 of manufacturing a semiconductor device 10 in accordance with some embodiments of the present disclosure, and FIGS. 5 to 24 illustrate cross-sectional views of intermediate stages in the formation of the semiconductor device 10 in accordance with some embodiments of the present disclosure. The stages shown in FIGS. 5 to 24 are referred to in the flow diagram in FIG. 4. In the following discussion, the fabrication stages shown in FIGS. 5 to 24 are discussed in reference to the process steps shown in FIG. 4.

Figure 5:
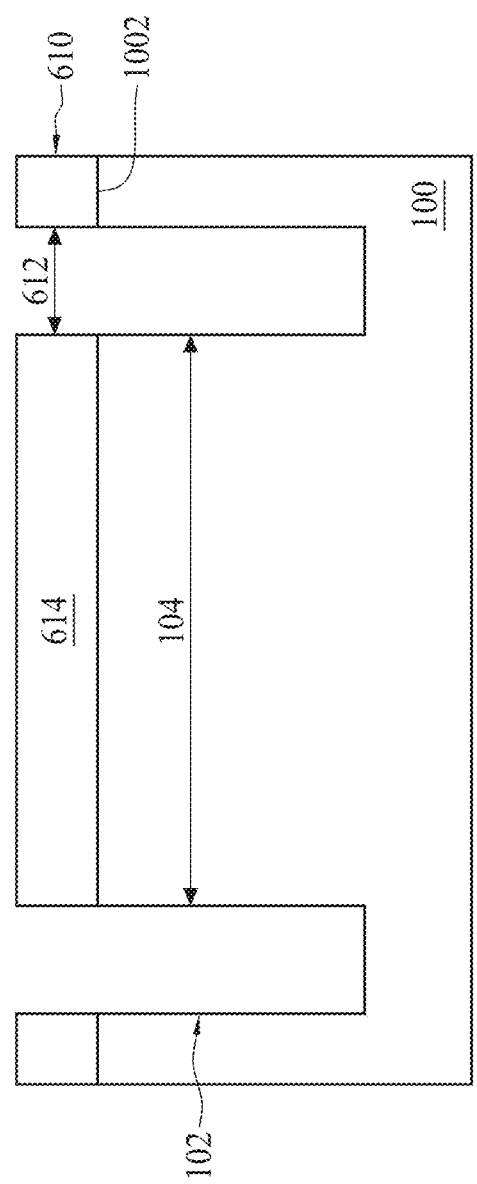
FIGS. 5 and 6 are cross-sectional views of intermediate stages in the formation of the semiconductor device in accordance with some embodiments of the present disclosure.

Referring to FIG. 5, one or more recesses 102 are formed in a semiconductor wafer 100 according to a step S602 in FIG. 4. The semiconductor wafer 100 is, for example, formed of silicon-containing material. Alternatively or additionally, the semiconductor wafer 100 may include other elementary semiconductor materials such as germanium. The semiconductor wafer 100 is a bulk semiconductor and a sacrificial pattern 610 including a repeating pattern of lines is applied on the semiconductor wafer 100. The sacrificial pattern 610 may be formed using a fine pattern formation technology such as a spacer-patterning technology (SPT) that is appropriate for formation of a line and space array. Alternatively, the sacrificial pattern 610 having a line and space array may be formed using a double-patterning technology (DPT), a double-exposure technology (DET), a lithography-lithography-etch (LLE) technology or a lithography-etch-lithography-etch (LELE) technology.

Subsequently, portions of the semiconductor wafer 100 are etched away using the sacrificial pattern 610 as a mask, thereby forming the recesses 102 in the semiconductor wafer 100 to separate a plurality of active regions 104 from each other. The recesses 102 are formed using at least one etching process to remove the portions of the semiconductor wafer 100 not protected by the sacrificial pattern 610. In some embodiments, the recesses 102 can have a uniform width, but the present disclosure is not limited thereto. After the formation of the recesses 102, the sacrificial pattern 610 is removed by any suitable operation.

Figure 6:
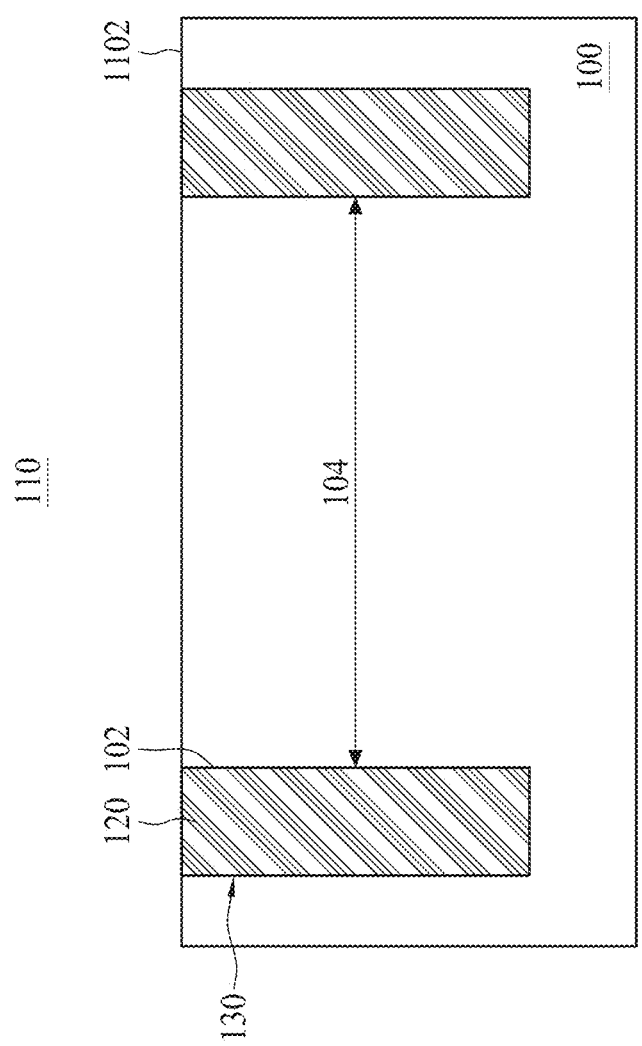

Referring to FIG. 6, an insulative material 120 is deposited in the recesses 102 according to a step S604 in FIG. 4. Accordingly, a substrate 110 including one or more isolation features 130 is formed. More particularly, the isolation features 130 are formed by filling the insulative material 120 in spaces between the active regions 104. More particularly, the insulative material 120 is conformally and uniformly deposited in the recesses 102 and on an upper surface 1002 (as shown in FIG. 5) of the semiconductor wafer 100 until the insulative material 120 fully fills the recesses 102, and a planarizing process is then performed to remove the insulative material 120 above the upper surface 1002 of the semiconductor wafer 100. The insulative material 120, including oxide or nitride, may be deposited using a (plasma) chemical vapor deposition (CVD) process, and the planarization of the insulative material 120 over the recesses 102 can be accomplished by, for example, a chemical mechanical polishing (CMP) process.

Figure 7:
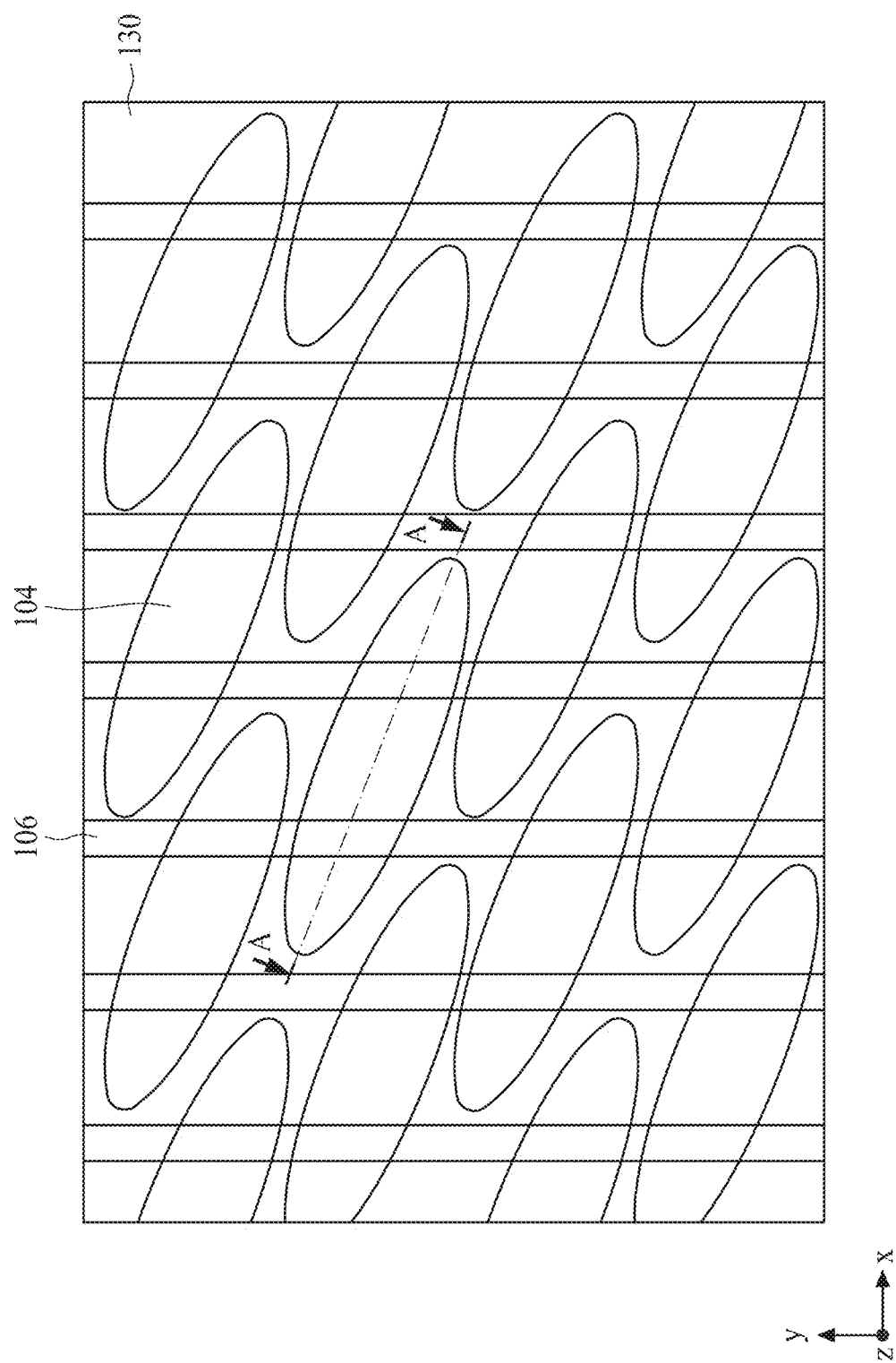
FIG. 7 is a plan view of a substrate formed with a plurality of trenches in accordance with some embodiments of the present disclosure.
Figure 8:
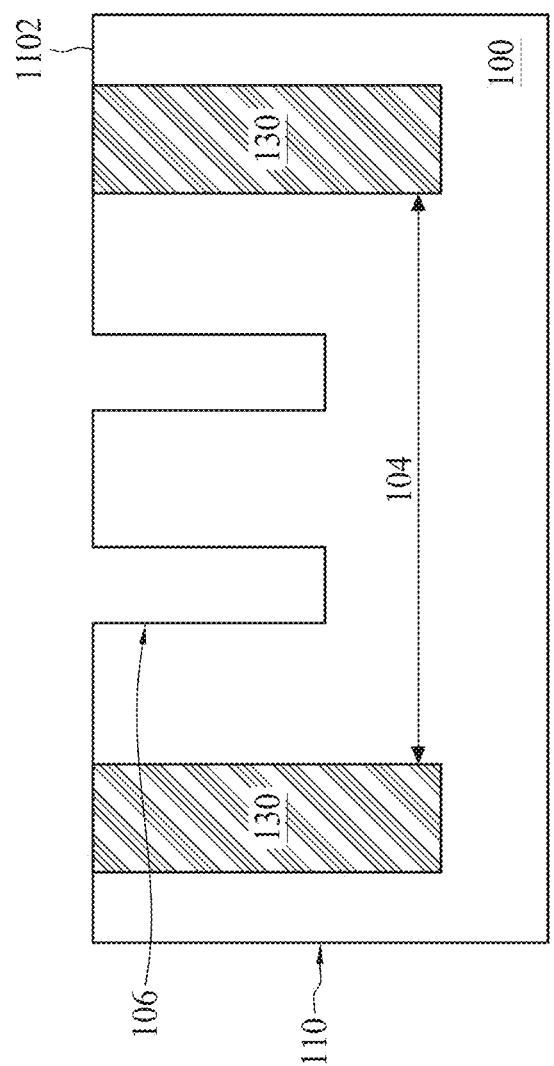
FIG. 8 is a cross-sectional view taken along A-A line in FIG. 7.

Referring to FIGS. 7 and 8, a plurality of trenches 106 are formed to generally cross the active regions 104 according to a step S606 in FIG. 4. The trenches 106 may be formed to be parallel with the y-axis in a plan view. In addition, each of the active regions 104 may be divided into three regions by a pair of trenches 106 intersecting the active region 104. The trenches 106 can be formed by steps including (1) applying a trench pattern (not shown) on the substrate 110, and (2) removing portions of the substrate 110 by an etching process. The substrate 110 is etched by, for example, a reactive ion etching (RIE) process, using the trench pattern as a mask. The trenches 106, shown in FIG. 8, have a uniform width; however, in some embodiments, bottoms of the trenches 106 may be rounded to reduce defect density and lower electric field concentration during the operating of the device.

Figure 9:
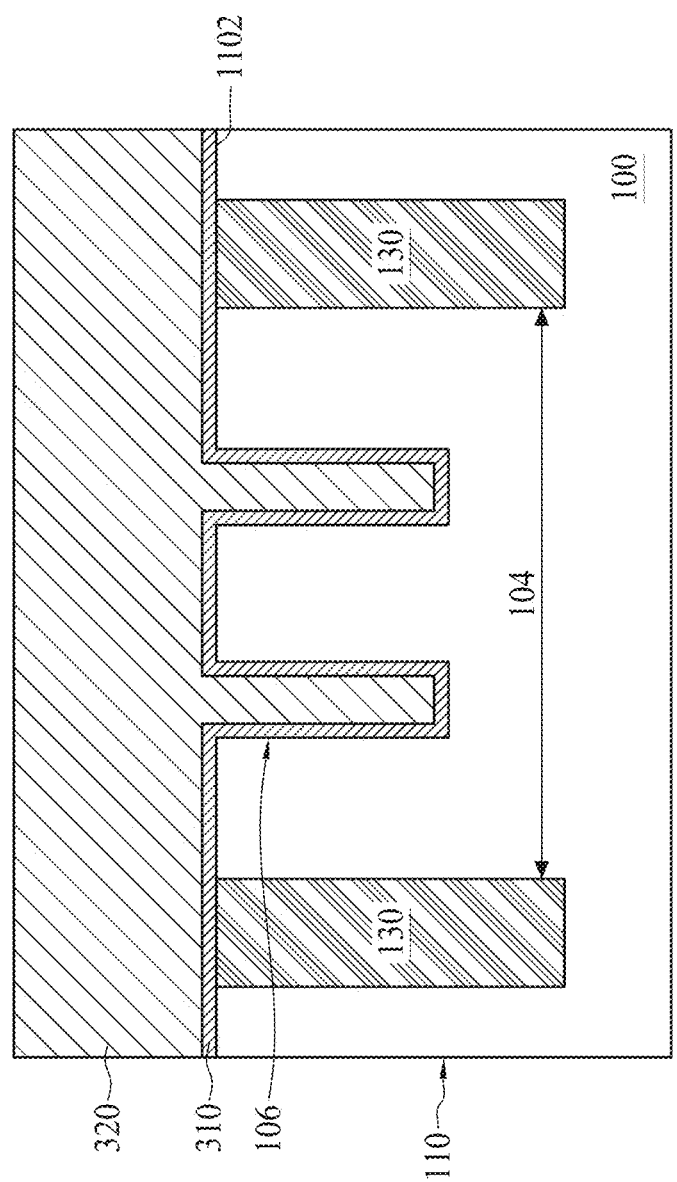
FIGS. 9 through 24 are cross-sectional views of intermediate stages in the formation of the semiconductor device in accordance with some embodiments of the present disclosure.

Referring to FIG. 9, a gate insulating layer 310 is formed on an exposed portion of the substrate 110 according to a step S608 in FIG. 4. The gate insulating layer 310, having a substantially uniform thickness, covers the exposed portion of the substrate 110, but does not fill the trench 106. That is, the gate insulating layer 310 is conformally coated on the exposed portion of the semiconductor wafer 100 and the isolation features 130. The gate insulating layer 310 can include oxide, nitride, oxynitride or high-k material, and can be deposited using a CVD process, an atomic layer deposition (ALD) process, or the like. Alternatively, if the semiconductor wafer 100 contains silicon material, the gate insulating layer 310, including oxide, can be grown on the exposed portion of the semiconductor wafer 100 using a thermal oxidation process.

Subsequently, a gate material 320 is disposed to fill the trenches 106 according to a step S610 in FIG. 4. The gate material 320 may be conformally and uniformly deposited on the gate insulating layer 310 until the trench 106 is entirely filled. The gate material 320 including polysilicon may be deposited in the trenches 106 using a CVD process, a physical vapor deposition (PVD) process, an ALD process or another suitable process. In some embodiments, the polysilicon is undoped.

Figure 10:
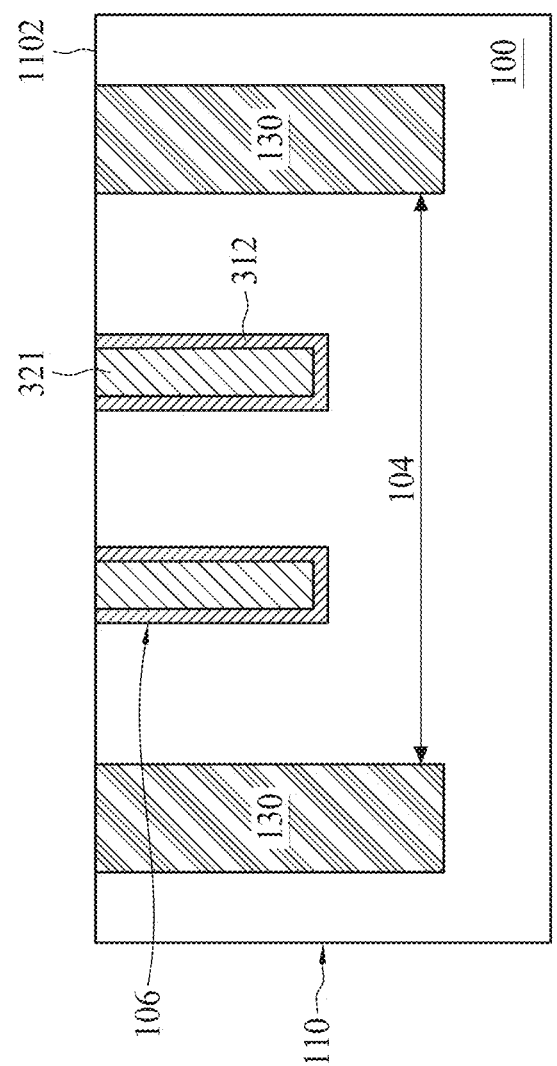

Referring to FIG. 10, a portion of the gate material 320 and portions of the gate insulating layer 310 above the upper surface 1102 of the substrate 110 are removed. As a result, a plurality of insulating liners 312 and a plurality of gate pillars 321 are formed. The removal of the portions of the gate insulating layer 310 and the gate material 320, overflowing the trenches 106, can be implemented using an etching process and/or a polishing process. After the removal process, the trenches 106 are fully occupied by the gate pillars 321 and the insulative liner 312 between the substrate 110 and the gate pillars 321.

Figure 11:
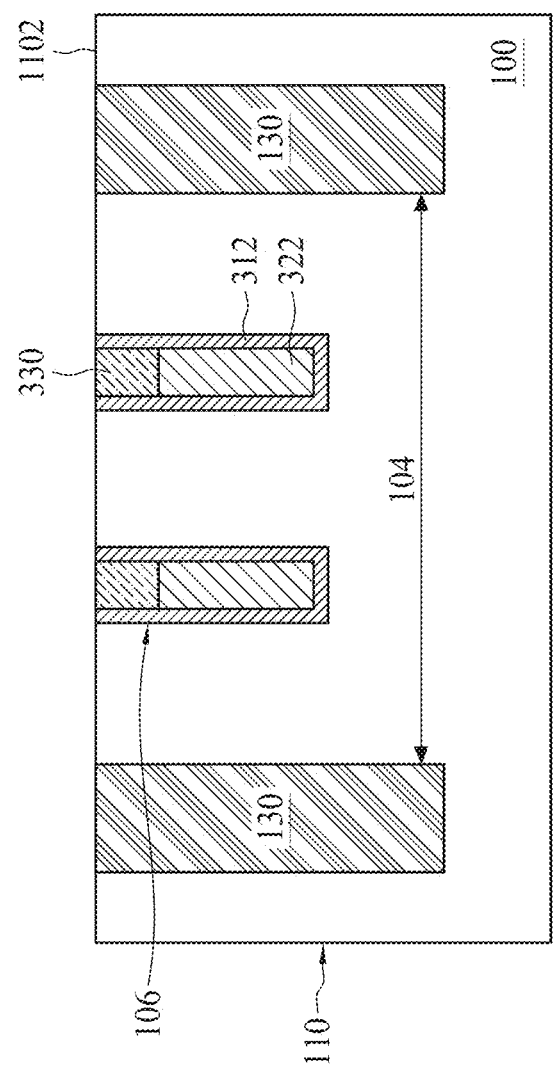

Referring to FIG. 11, the gate pillars 321 are recessed below the upper surface 1102 of the substrate 110 according to a step S612 in FIG. 4. Consequently, a plurality of word lines 322 are formed. The word lines 322 can be formed by recessing the gate pillars 321 into the substrate 110 using an etching process, such as an RIE process. In some embodiments, the insulative liner 312 can be optionally recessed below the upper surface 1102 of the substrate 110.

After the formation of the word lines 322, a capping layer 330 is formed on the word lines 322 according to a step S614 in FIG. 4. The capping layer 330 functions as a passivation layer for protecting the word lines 322. The capping layer 330 can be formed by depositing an insulator including silicon oxide, silicon nitride, silicon oxynitride, hafnium dioxide or zirconium dioxide, for example, in the trenches 106.

Figure 12:
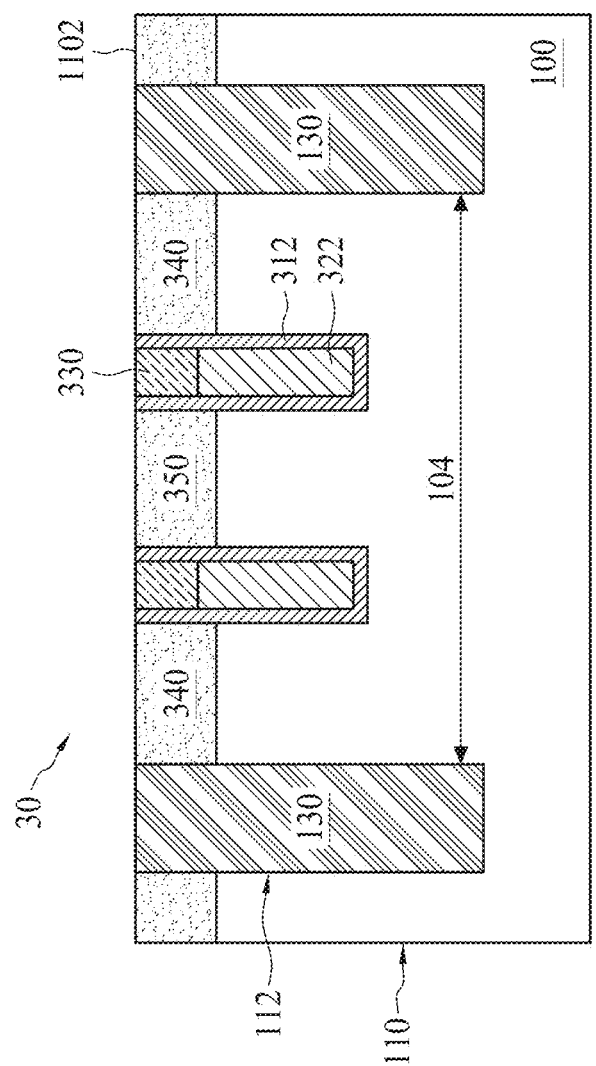

Referring to FIG. 12, dopants are introduced into the substrate 110 to form impurity regions 340 and 350 on either side of the word lines 322 according to a step S616 in FIG. 4. Accordingly, the (recessed) access transistors 30 are completely formed. The impurity regions 340 and 350 can serve as source and drain regions of the access transistors 30. The introduction of the dopants into the substrate 110 is achieved by a diffusion process or an ion-implantation process. The dopant introduction may be performed using boron or indium if the respective access transistor 30 is a p-type transistor, or using phosphorous, arsenic, or antimony if the respective access transistor 30 is an n-type transistor.

After the formation of the access transistor 30, a first dielectric layer 402 is formed thereon according to a step S618 in FIG. 4. The first dielectric layer 402 can be formed by uniformly depositing a first dielectric material, using a CVD process, to cover the upper surface 1102 of the substrate 110 and the access transistors 30. Alternatively, the first dielectric material 402 may be formed on the substrate 110 and the access transistor 30 using a spin-coating process. The first dielectric layer 402 may be planarized, using, for example, a CMP process, to yield an acceptably flat topology. The first dielectric layer 402 can include oxide, tetraethylorthosilicate (TEOS), undoped silicate glass (USG), phosphosilicate glass (PSG), borosilicate glass (BSG), borophosphosilicate glass (BPSG), fluoride silicate glass (FSG), spin-on glass (SOG), tonen silazene (TOSZ), or combinations thereof.

Figure 13:
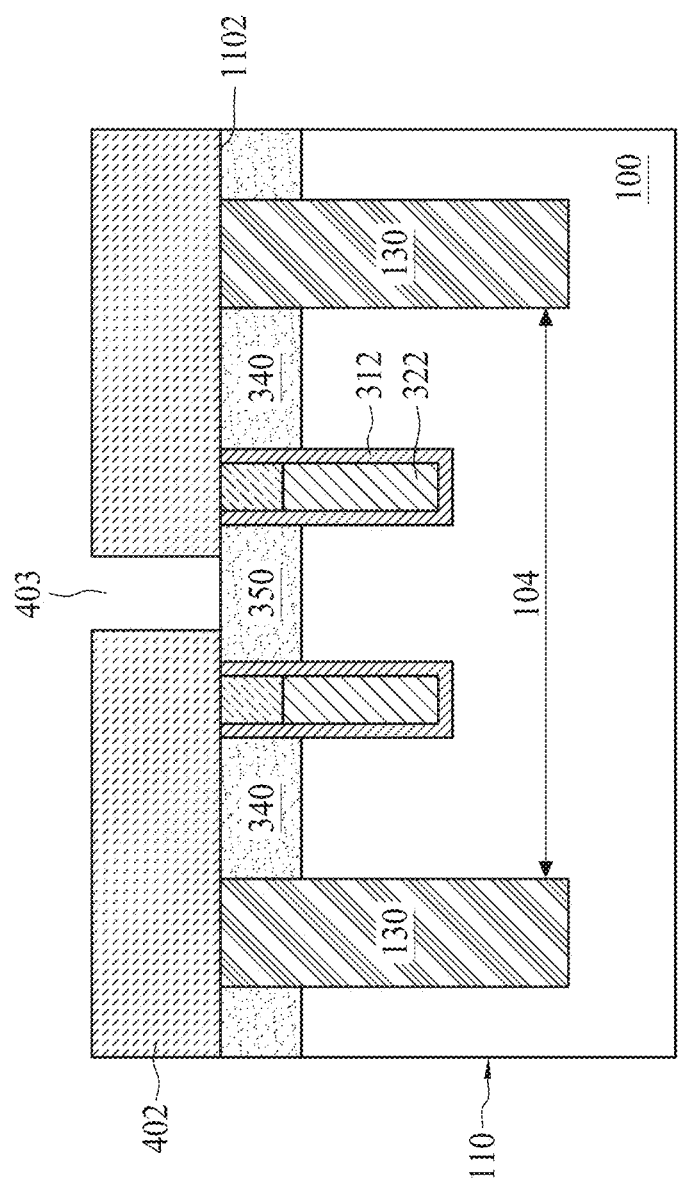
Figure 14:
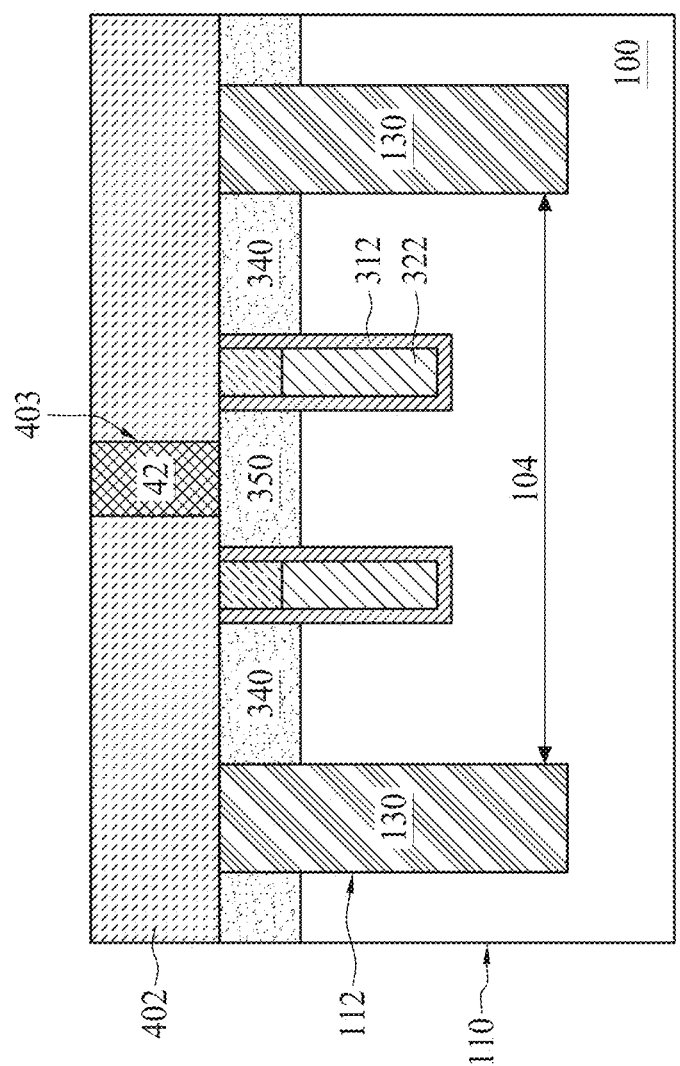

Referring to FIGS. 13 and 14, a conductive plug 42 is formed to contact the impurity region 350 according to a step S620 in FIG. 4. The conductive plug 42 can be formed by (1) applying a photoresist pattern (not shown) to define an area to be etched and to protect the other regions of the first dielectric layer 402, (2) performing an etching process using the photoresist pattern as a mask to create the opening 403 penetrating through the first dielectric layer 402, thereby exposing the associated impurity region 350, and (3) depositing a first conductive material in the opening 403. The photoresist pattern may be removed, for example, using an ashing process or a wet etching process before the deposition of the first conductive material, and a planarizing process is optionally performed to remove excess portions of the first conductive material on the first dielectric layer 402. That is, the first dielectric layer 402 serves as a stop layer during the performing of the planarizing process. The first conductive material can include tungsten and is deposited using a CVD process.

Figure 15:
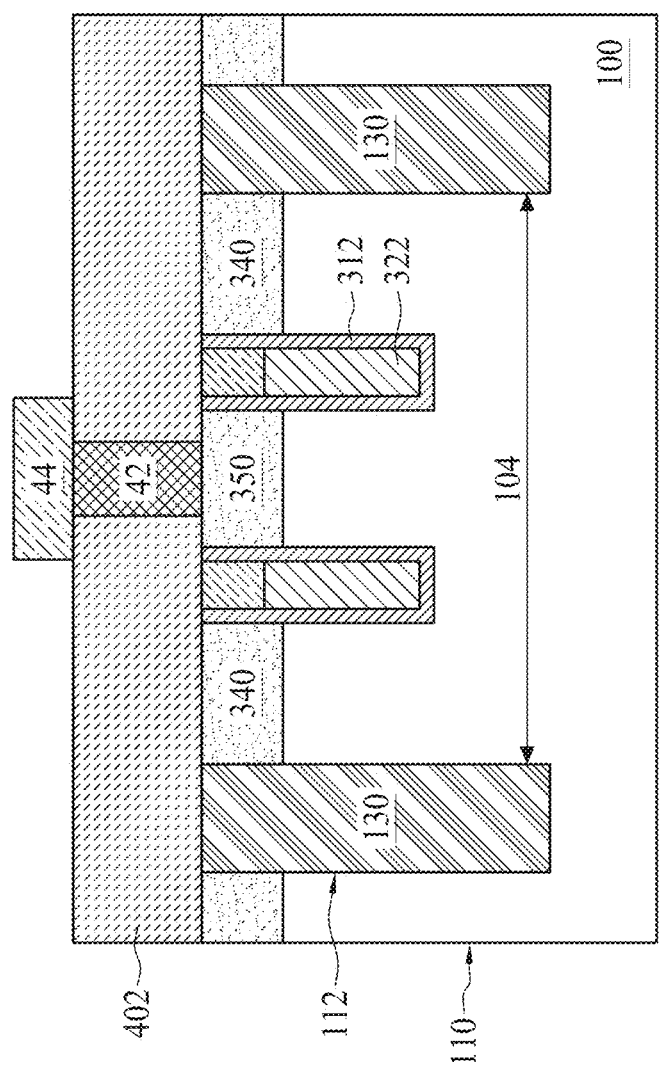

Referring to FIG. 15, a bit line 44, contacting the conductive plug 42, is formed according to a step S621 in FIG. 4. The bit line 44 is formed by depositing a second conductive material to bury the first dielectric layer 402 and the conductive plug 42 and patterning the second conductive material with a bit line pattern, using an anisotropic etching process, for example.

Subsequently, a second dielectric layer 404 is applied on the first dielectric layer 402 and the bit line 44 according to a step S622 in FIG. 4. The second dielectric layer can be conformally deposited using a CVD process; however, in some embodiments, the second dielectric layer may be formed using spin-on coating technology. Additionally, a CMP process is used to provide a planar topography on the second dielectric layer 402. The second dielectric layer 404 includes a dielectric material having etch characteristics different from those of the substrate 110. As such, the substrate 110 may be selectively etched relative to the second dielectric layer 404.

Figure 16:
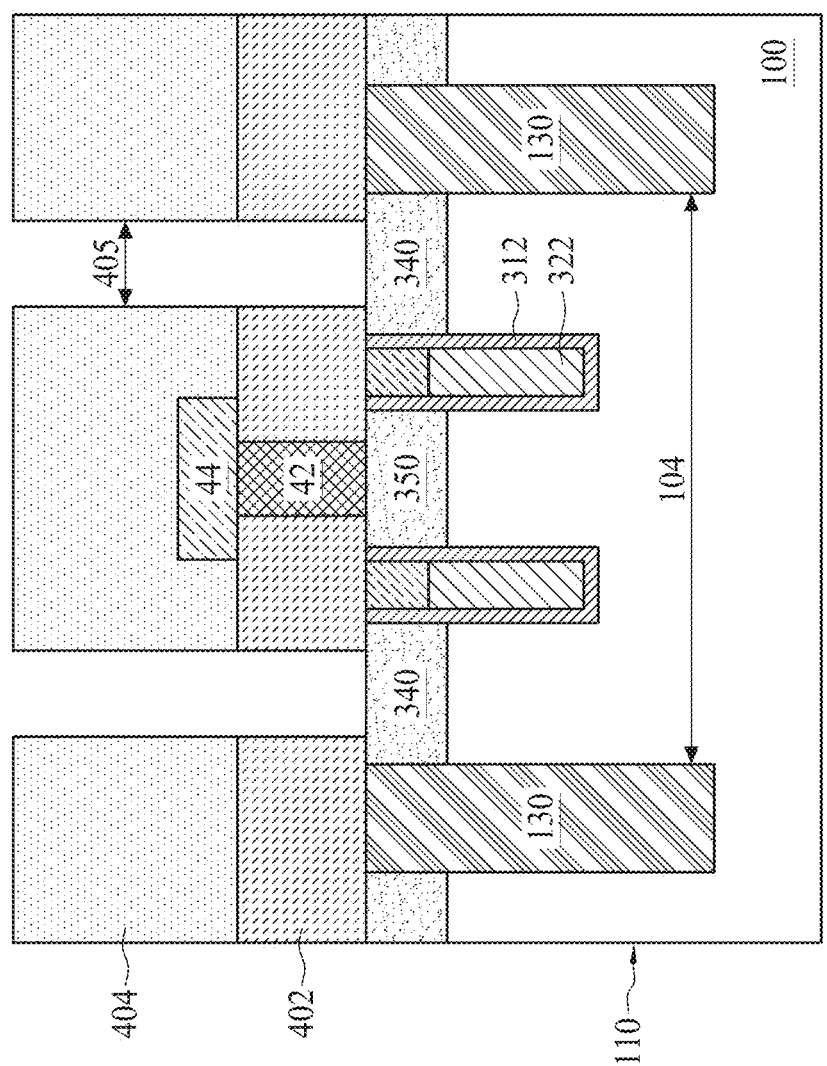

Referring to FIG. 16, portions of the first and second dielectric layer 402 and 404 are removed to form a plurality of first contact holes 405 exposing the impurity regions 340 according to a step S624 in FIG. 4. The second dielectric layer 404 and the first dielectric layer 402, including the same material or the same etch characteristics, are sequentially etched using an etching process using at least one reactive ion etching (RIE) process, for example. Alternatively, the first and second dielectric layers 402 and 404, having different materials, are anisotropically dry-etched, utilizing multiple etchants, selected based on the materials of the first and second dielectric layers 402 and 404, to sequentially etch the second dielectric layer 404 and the first dielectric layer 402.

Figure 17:
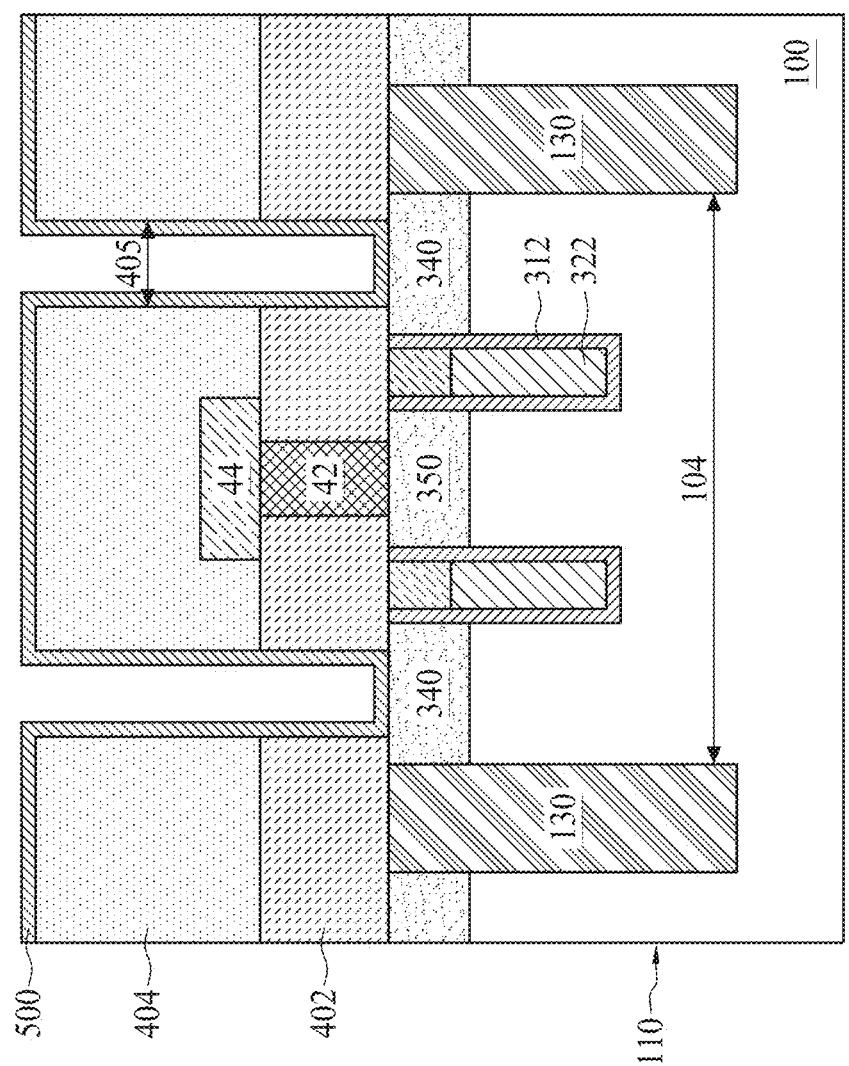

Referring to FIG. 17, a sacrificial film 500 is conformally formed on the exposed portions of the impurity regions 340, the first dielectric layer 402, and the second dielectric layer 404. The sacrificial film 500 has a substantially uniform thickness and a topology following the topology of the exposed portions of the impurity regions 340, the first dielectric layer 402, and the second dielectric layer 404. Notably, the sacrificial layer 500 includes a dielectric material having etch characteristics different from those of the substrate 110. For example, the sacrificial film 500 can include nitride and be deposited using a CVD process, an ALD process, or the like.

Figure 18:
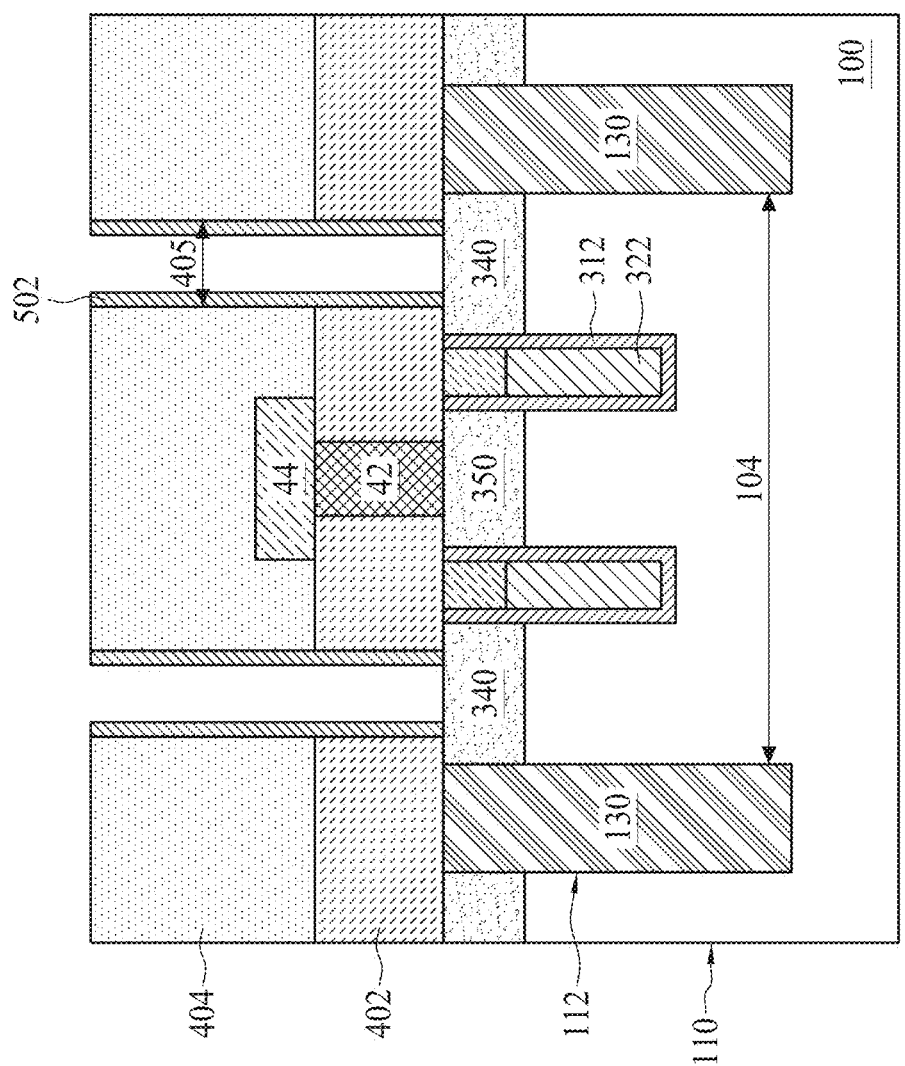

Referring to FIG. 18, a removal process is performed to remove at least portions of the sacrificial film 500 covering the impurity regions 340. Specifically, the anisotropic etching process is performed to remove horizontal portions of the sacrificial film 500 on the impurity regions 340 and over the second dielectric layer 402, while vertical portions of the sacrificial film 500 are left on the first and second dielectric layers 402 and 404, to thereby form a plurality of sacrificial liners 502 in the first contact holes 405 (step S626 in FIG. 4). The horizontal portions of the sacrificial film 500 are removed using an anisotropic etching process. The chemistry of the anisotropic etching process can be selective to the material of the sacrificial film 500. In other words, no substantial quantities of the materials of the substrate 110 and the first and second dielectric layers 402 and 404 are removed during the etching of the horizontal portions of the sacrificial film 500.

Figure 19:
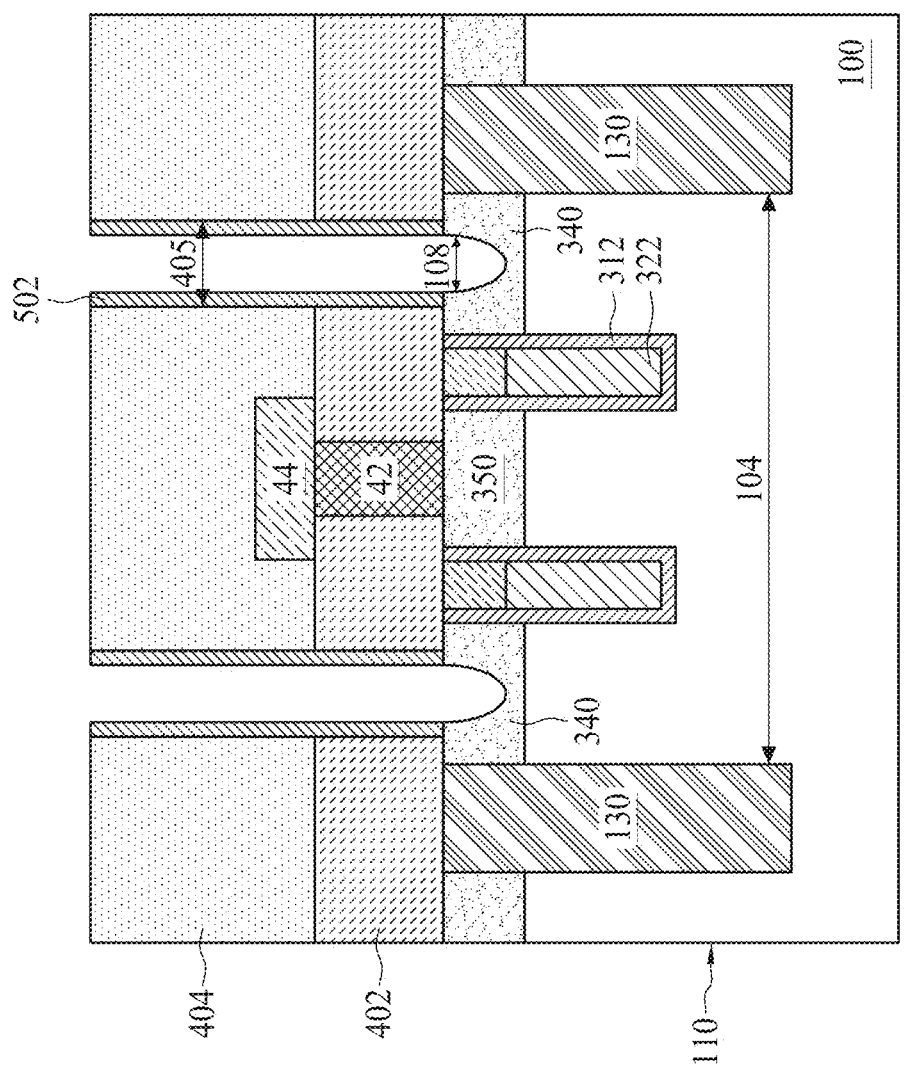

Referring to FIG. 19, portions of the substrate 110 exposed through the first and second dielectric layers 402 and 404 and the sacrificial liners 502 are etched away according to a step S628 in FIG. 4. As a result, a plurality of second contact holes 108 connected to the first contact holes 405 are formed. The portions of the substrate 110 exposed through the first and second dielectric layers 402 and 404 and the sacrificial liners 502 are anisotropically dry-etched, using at least one reactive ion etching (RIE) process, for example, through the first contact holes 405 to form the second contact hole 108 in the substrate 110. The second dielectric layer 404 and the sacrificial liner 502 function as a mask during the etching of the substrate 110.

Figure 20:
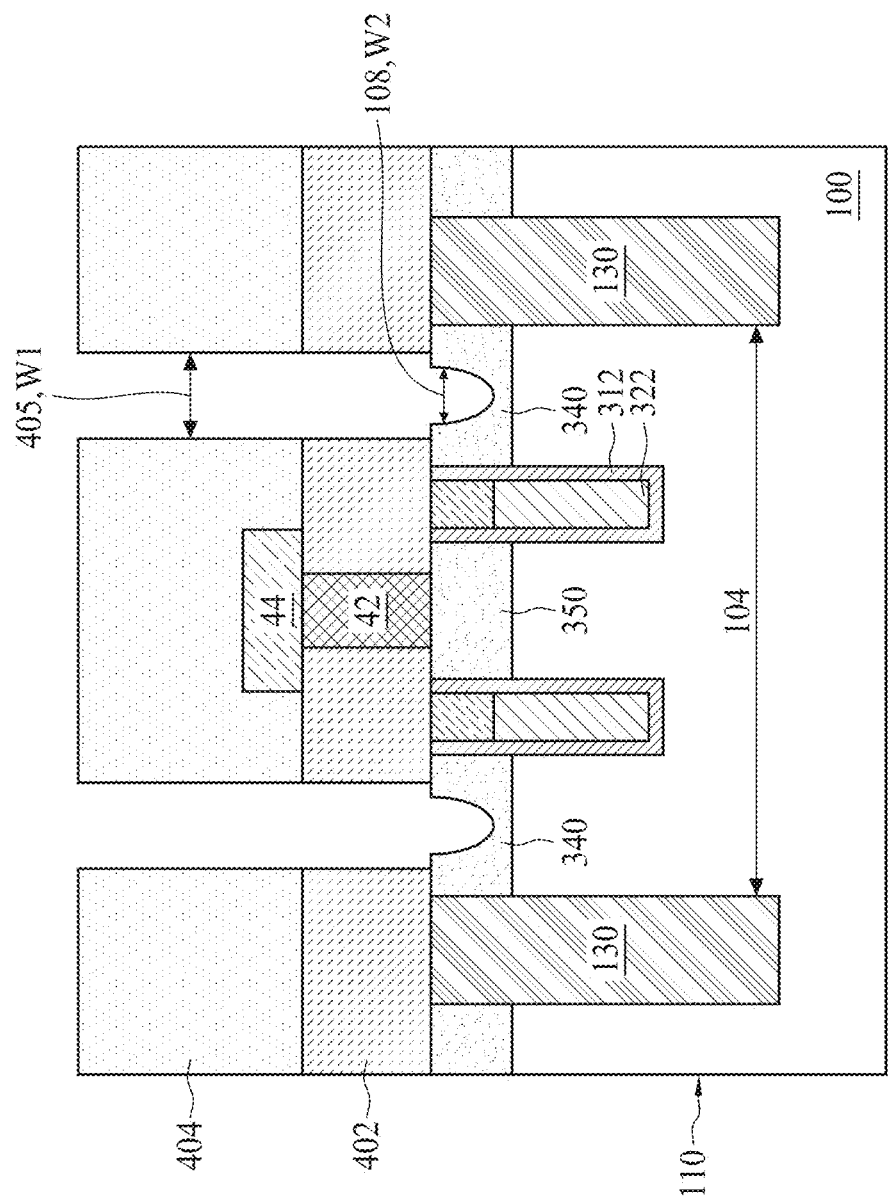
Figure 21:
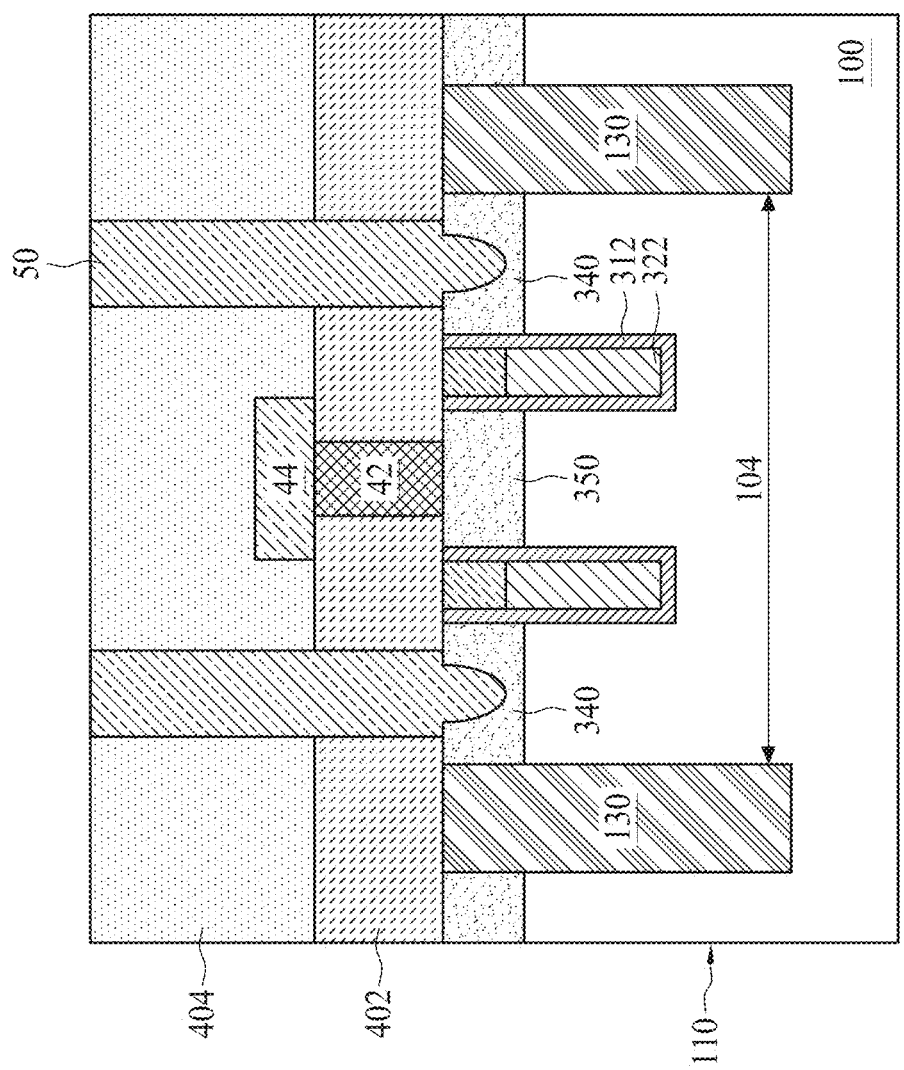

Referring to FIGS. 19 to 21, after the formation of the second contact holes 108, the sacrificial liners 502 are removed, and a conductive material is deposited in the first conductive holes 405 and second conductive holes 108 to form conductive features 50 according to a step S630 in FIG. 4. The sacrificial liners 502 are removed using a stable process such as a wet etching process. As shown in FIG. 20, the first contact holes 405 have a substantially uniform first width W1, and the second contact holes 108 have a non-uniform second width W2. In some embodiments, the second width W2 gradually decreases at positions of increasing distance from the upper surface 1102 of the substrate 110. The conductive feature 50, including polysilicon, is deposited in the first and second contact holes 405 and 108 using a CVD process, for example. The portion of the conductive feature 50 in the substrate 110 may have a funnel shape. Notably, the conductive features 50 surrounded by the first and second dielectric layers 402 and 404 may have a greater critical dimension once the sacrificial liner 502 is removed prior to the formation of the conductive features 50; as a result, a resistance of the conductive features 50 may be reduced. However, in some embodiments, the sacrificial liners 502 may be left in the resulting semiconductor device 10 if the material of the conductive features 50 has an acceptable resistivity. In such embodiments, a diffusion barrier layer, having a substantially uniform thickness, may be deposited on the exposed portion of the substrate 110 and the sacrificial liners 502 to prevent the conductive features 50 from flaking or spalling from the sacrificial liners 502, including nitride.

Referring again to FIGS. 7, 19 and 20, the impurity region 350 is disposed at the center of the active region 104 having the elliptical shape, and the impurity regions 340 are disposed on either side of the impurity regions 350; thus, the area for forming the conductive feature 50 is less than the area for landing the conductive plug 42. The sacrificial liner 502 is employed to limit the location where the substrate 110 is etched through the first contact holes 405, thereby preventing occurrence of cracking at locations where the conductive features 50 are disposed.

Figure 22:
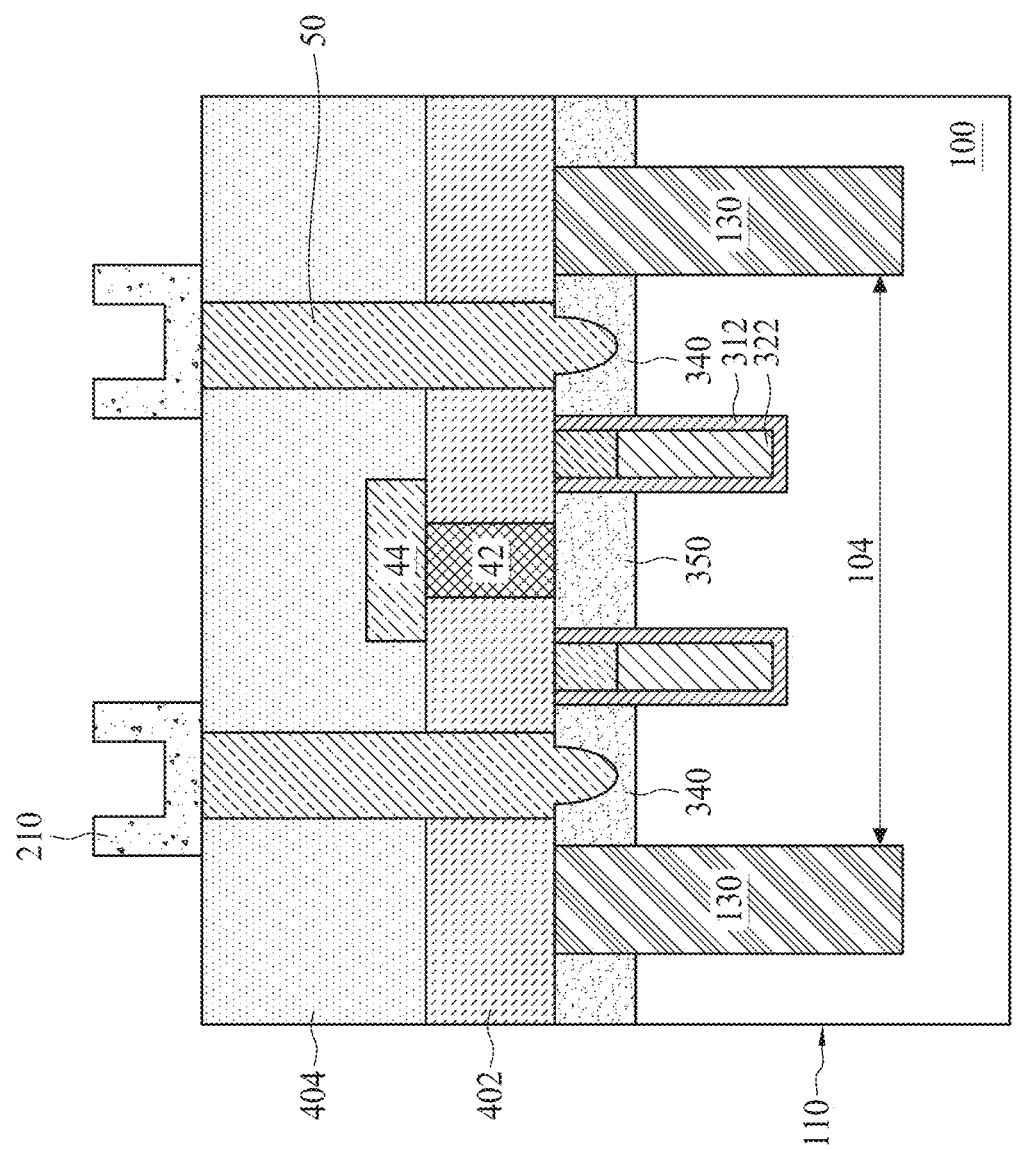
Figure 23:
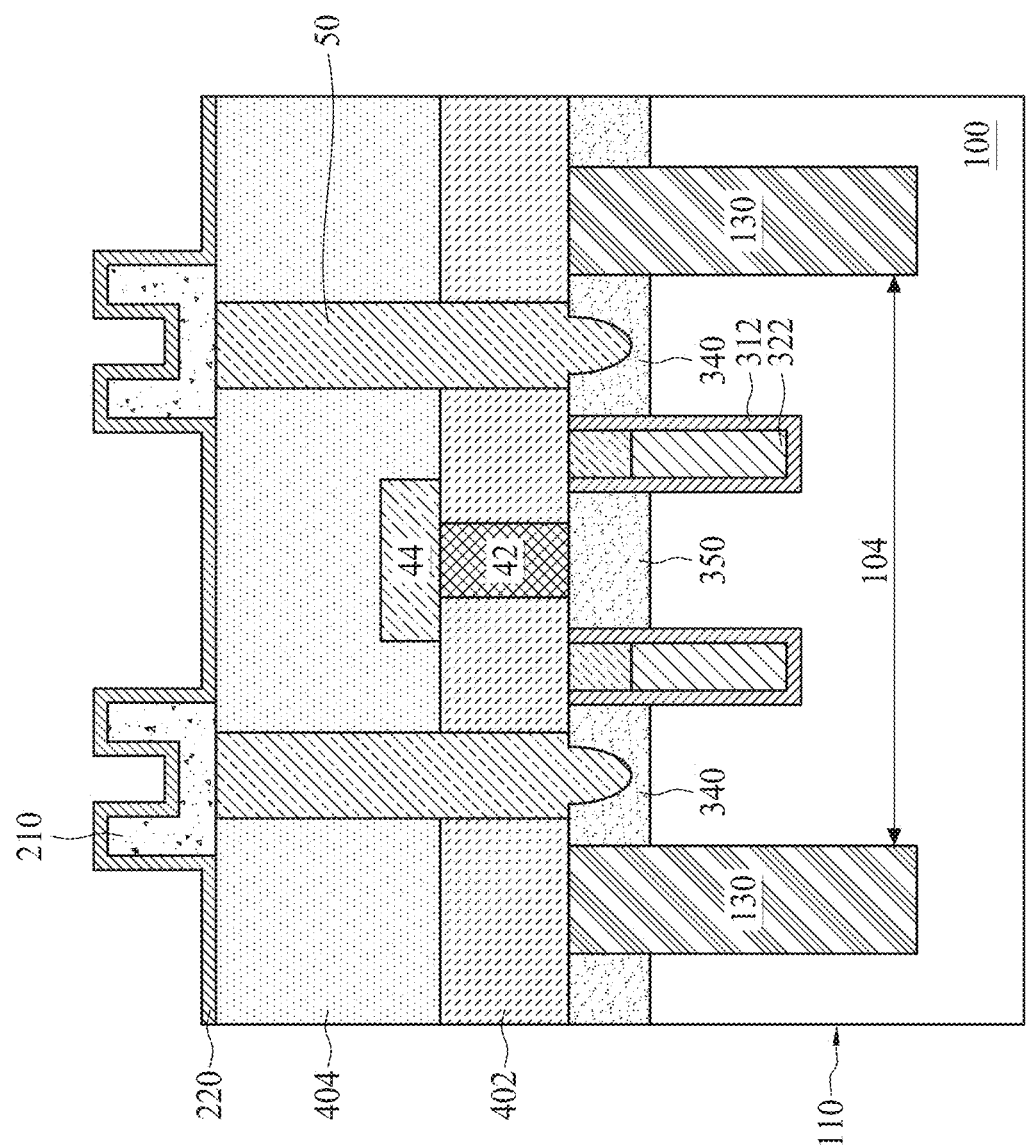
Figure 24:
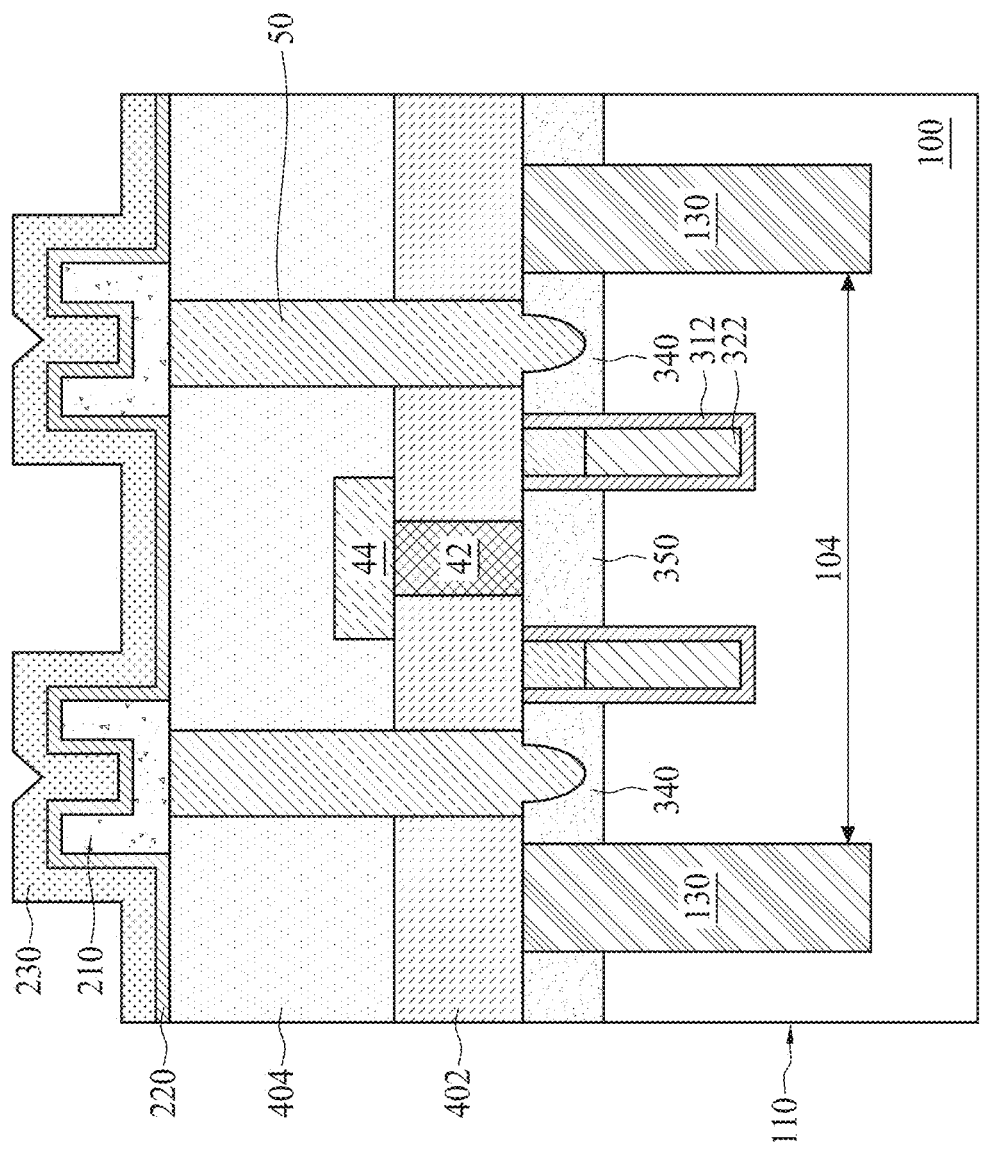

Referring to FIGS. 22 to 24, a plurality of storage capacitors 20 are formed on the second dielectric layer 404 and the conductive features 50 according to a step S632 in FIG. 4. Accordingly, the semiconductor device 10 is completely formed. Specifically, the storage capacitor 20 includes a plurality of storage nodes 210 in contact with the conductive features 50, respectively.

The fabrication of the storage nodes 210 involves sequentially depositing a blanket sacrificial layer (not shown), having a sufficient thickness, on the second dielectric layer 404 and the conductive features 50, patterning the sacrificial layer using lithography and etching processes to creating a plurality of windows to expose the conductive features 50 and portions of the second dielectric layer 404 in contact with the conductive features 50, conformally depositing a conductive layer on the remaining sacrificial layer, the conductive features 50, and portions of the second dielectric layer 404 exposed through the windows, and removing portions of the conductive layer on a topmost surface of the remaining sacrificial layer. The remaining sacrificial layer is then removed from the second dielectric layer 404, while the U-shaped storage node 210, as shown in FIG. 22, is left in place. The sacrificial layer includes a dielectric material having etch characteristics different from those of the second dielectric layer. As a result, the sacrificial layer may be selectively etched relative to the second dielectric layer. The storage nodes 210 may be formed of doped polysilicon or metal such as titanium nitride (TiN) or ruthenium (Ru).

Referring to FIG. 23, a capacitor insulator 220, having a substantially uniform thickness, is formed to cover the second dielectric layer 404 and the storage nodes 210. That is, the capacitor insulator 220 is a conformal layer. That is, the capacitor insulator 220 have a topology following the topology of the storage nodes 210 and the second dielectric layer 404. The capacitor insulator 220 may include silicon dioxide ($SiO_2$), silicon nitride ($Si_3N_4$), or high-k materials such as zirconium oxide ($Zr_2O_2$), hafnium oxide ($HfO_2$), titanium oxide ($TiO_2$), or aluminum oxide ($Al_2O_2$). In some embodiments, the capacitor insulator 220 may be formed of either a double film of nitride/oxide film or a triple film of oxide/nitride/oxide.

Referring to FIG. 24, a top electrode 230 is deposited on the capacitor insulator 220. In some embodiments, the top electrode 230 may be a substantially conformal layer and may be formed by a CVD process. In alternative embodiments, the top electrode 230 may have a substantially planar top surface 232, as shown in FIGS. 1 and 3. The top electrode 230 may be formed of low-resistivity material, such as titanium nitride or combinations of titanium nitride, tantalum nitride (TaN), tungsten nitride (WN), ruthenium, iridium (Ir), and platinum (Pt).

In conclusion, with the configuration of the conductive feature 50 having the lower portion 510 extending into the substrate 110 where the access transistors 30 are formed, the contact area of the conductive feature 50 and the access transistors 30 is increased. As a result, a contact resistance between the conductive feature 50 and the access transistors 30 can be effectively reduced.

One aspect of the present disclosure provides a semiconductor device. The semiconductor device comprises a substrate, a storage capacitor, an access transistor, and at least one conductive feature. The substrate comprises at least one isolation feature defining a plurality of active regions. The storage capacitor is disposed over the substrate. The access transistor comprises a plurality of impurity regions in the active region. The conductive feature extends from the storage capacitor and into the substrate for electrically coupling the storage capacitor to the access transistor.

One aspect of the present disclosure provides a method of manufacturing a semiconductor device. The method comprises steps of providing a substrate comprising one or more isolation features defining active regions; forming an access transistor comprising a plurality of impurity regions, wherein the impurity regions are disposed in the substrate; depositing a dielectric layer to cover the access transistor; forming a first contact hole through the dielectric layer to expose the associated impurity region; forming a sacrificial liner in the first contact hole; removing a portion of the substrate exposed through the first contact hole and the sacrificial liner to form a second contact hole connected to the first contact hole; and depositing a conductive material in the first and second contact holes.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor device, comprising:
a substrate comprising a plurality of isolation features defining a plurality of active regions; a storage capacitor over the substrate;
an access transistor comprising a plurality of impurity regions in the active region; and at least one conductive feature extending from the storage capacitor and into the substrate for electrically coupling the storage capacitor to the access transistor;
wherein the conductive feature comprises a lower portion in the substrate and an upper portion interposed between the substrate and the storage capacitor, the lower portion has a first critical dimension and the upper portion has a second critical dimension greater than the first critical dimension;
wherein the lower portion of the conductive feature in the substrate is not in direct contact with any of the plurality of isolation features in the substrate.

2. The semiconductor device of claim 1, wherein the conductive feature is inserted into the associated impurity region.

3. The semiconductor device of claim 2, wherein a portion of the conductive feature in the substrate has a funnel shape.

4. The semiconductor device of claim 1, wherein the first critical dimension of the lower portion of the conductive feature gradually decreases at positions of increasing distance from the upper portion.

5. The semiconductor device of claim 1, wherein the lower portion of the conductive feature has a peripheral surface, which is discontinuous with a peripheral surface of the upper portion of the conductive feature.

6. The semiconductor device of claim 1, wherein the lower portion and the upper portion of the conductive feature are integrally formed.

7. The semiconductor device of claim 1, wherein the access transistor further comprises:
a plurality of word lines disposed in the substrate and across the active regions, wherein the impurity regions are disposed on either side of the word line; and
a plurality of insulative liners sandwiched between the substrate and the word lines.

8. The semiconductor device of claim 7, further comprising:
a dielectric layer between the storage capacitor and the substrate to encapsulate the access transistor and enclose the conductive feature;
a bit line buried in the dielectric layer; and a conductive plug extending from the bit line and into the substrate for electrically coupling the bit line to the access transistor.

9. The semiconductor device of claim 8, wherein a portion of the conductive plug, inserted into the impurity region, has a third critical dimension, and the other portion of the conductive plug interposed between the bit line and the substrate has a fourth critical dimension greater than the third critical dimension.

10. The semiconductor device of claim 7, wherein the storage capacitor comprising:
   at least one storage node in contact with the conductive feature;
   a capacitor insulator encapsulating the storage node; and
   a top electrode on the capacitor insulator.

* * * * *